(12) United States Patent
Imamura

(10) Patent No.: US 9,166,549 B2
(45) Date of Patent: Oct. 20, 2015

(54) HIGH-FREQUENCY FILTER

(71) Applicant: Murata Manufacturing Co., Ltd., Nagaokakyo-shi, Kyoto-fu (JP)

(72) Inventor: Mitsutoshi Imamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 207 days.

(21) Appl. No.: 13/950,516

(22) Filed: Jul. 25, 2013

(65) Prior Publication Data

US 2014/0077895 A1    Mar. 20, 2014

(30) Foreign Application Priority Data

Sep. 14, 2012   (JP) ................... 2012-202156

(51) Int. Cl.
| | |
|---|---|
| *H03H 7/01* | (2006.01) |
| *H03H 7/09* | (2006.01) |
| *H01P 1/203* | (2006.01) |
| *H03H 1/00* | (2006.01) |

(52) U.S. Cl.
CPC ......... *H03H 7/0115* (2013.01); *H01P 1/20345* (2013.01); *H03H 7/09* (2013.01); *H03H 2001/0085* (2013.01)

(58) Field of Classification Search
CPC   H03H 2001/0085; H03H 7/09; H03H 7/0115
USPC .................................................. 333/185, 175
See application file for complete search history.

(56) References Cited

U.S. PATENT DOCUMENTS

| | | | |
|---|---|---|---|
| 8,212,633 B2 * | 7/2012 | Taniguchi | ............... 333/175 |
| 2011/0074526 A1 * | 3/2011 | Taniguchi | ............... 333/185 |
| 2012/0319800 A1 | 12/2012 | Sasaki et al. | |
| 2012/0319801 A1 | 12/2012 | Taniguchi | |

FOREIGN PATENT DOCUMENTS

| | | |
|---|---|---|
| JP | 2002-76807 A | 3/2002 |
| WO | 2007/119356 A1 | 10/2007 |
| WO | 2011/114851 A1 | 9/2011 |
| WO | 2012/111370 A1 | 8/2012 |

OTHER PUBLICATIONS

Official Communication issued in corresponding Japanese Patent Application No. 2012-202156, mailed on Jul. 1, 2014.

* cited by examiner

*Primary Examiner* — Robert Pascal
*Assistant Examiner* — Rakesh Patel
(74) *Attorney, Agent, or Firm* — Keating & Bennett, LLP

(57) ABSTRACT

In a high-frequency filter, four LC parallel resonators include four capacitors and four resonance coils, and are aligned in a predetermined direction. The four capacitors are defined by a ground conductor and a resonance capacitor conductor. The four coils are defined by a first via conductor, a second via conductor, and a line conductor. A floating conductor is provided astride within the four coils, and a sum of electrostatic capacitance between line conductors and the floating conductor is larger than electrostatic capacitance between the resonance capacitor conductor and the floating conductor, the line conductors overlapping with the floating conductor in planar view from a lamination direction.

19 Claims, 11 Drawing Sheets

HIGH-FREQUENCY FILTER

BACKGROUND OF THE INVENTION

1. Field of the Invention

The present invention relates to a high-frequency filter, and more specifically, relates to a high-frequency filter including a plurality of LC parallel resonators.

2. Description of the Related Art

As a high-frequency filter of the related art, for example, a laminated band pass filter has been known that is described in International Publication No. 2007/119356. FIG. 10 is the exploded perspective view of the laminated band pass filter described in International Publication No. 2007/119356. FIG. 11 is the equivalent circuit diagram of the laminated band pass filter described in International Publication No. 2007/119356.

As illustrated in FIG. 10, a laminated band pass filter 500 is a laminated body including a ground electrode forming layer 401, a capacitor electrode forming layer 402, an input-output electrode forming layer 403, a line electrode forming layer 404, and an outer layer 405, and includes four LC parallel resonators and a between-input-and-output capacitor electrode 260.

Capacitor electrodes 411, 412, 413, and 414 in the capacitor electrode forming layer 402 face a ground electrode 409. As a result, capacitors C501 to C504 illustrated in FIG. 11 are configured. A via electrode 441 connects an input-output electrode 721 and the capacitor electrode 411 to each other. A via electrode 442 connects an input-output electrode 722 and the capacitor electrode 414 to each other.

As illustrated in FIG. 10, a via electrode 431 connects the capacitor electrode 411 and one end of a line electrode 616 to each other, and a via electrode 432 connects the other end of the line electrode 616 and the ground electrode 409 to each other. Accordingly, an inductor L501 illustrated in FIG. 11 is configured. A via electrode 433 connects the ground electrode 409 and one end of a line electrode 617 to each other, and a via electrode 434 connects the other end of the line electrode 617 and the capacitor electrode 412 to each other. Accordingly, an inductor L502 illustrated in FIG. 11 is configured. A via electrode 435 connects the ground electrode 409 and one end of a line electrode 618 to each other, and a via electrode 436 connects the other end of the line electrode 618 and the capacitor electrode 413 to each other. Accordingly, an inductor L503 illustrated in FIG. 11 is configured. A via electrode 437 connects the capacitor electrode 414 and one end of a line electrode 619 to each other, and a via electrode 438 connects the other end of the line electrode 619 and the ground electrode 409 to each other. Accordingly, an inductor L504 illustrated in FIG. 11 is configured.

As a result of including such individual electrodes as described above, the laminated band pass filter 500 includes a four-stage LC parallel resonance circuit and a coupling capacitance C514.

In addition, in the laminated band pass filter 500, so as to obtain a desired pass band characteristic, LC parallel resonators not adjacent to each other are capacitively coupled to each other. Here, the capacitive coupling between the LC parallel resonators not adjacent to each other is capacitive coupling between an LC parallel resonator including the inductor L501 and the capacitor C501 and an LC parallel resonator including the inductor L504 and the capacitor C504. In more detail, the between-input-and-output capacitor electrode 260 is provided in the input-output electrode forming layer 403, and faces the capacitor electrode 411 and the capacitor electrode 414. Accordingly, capacitance is generated between the between-input-and-output capacitor electrode 260 and the capacitor electrode 411, and capacitance occurs between the between-input-and-output capacitor electrode 260 and the capacitor electrode 414. As a result, the LC parallel resonator including the inductor L501 and the capacitor C501 and the LC parallel resonator including the inductor L504 and the capacitor C504 are capacitively coupled to each other. The coupling capacitance C514 in FIG. 11 indicates capacitance occurring between the LC parallel resonator including the inductor L501 and the capacitor C501 and the LC parallel resonator including the inductor L504 and the capacitor C504.

Incidentally, in the laminated band pass filter 500, so as to obtain the desired pass band characteristic, the coupling capacitance C514 is produced between the LC parallel resonator including the inductor L501 and the capacitor C501 and the LC parallel resonator including the inductor L504 and the capacitor C504, as described above. Therefore, the between-input-and-output capacitor electrode 260 is located near the capacitor electrodes 411 and 414. In addition, so as to produce the resonance capacitors C501 and C504 illustrated in FIG. 11, the capacitor electrodes 411 and 414 are located near the ground electrode 409. As a result, in the laminated band pass filter 500, the between-input-and-output capacitor electrode 260 is located near the ground electrode 409. Accordingly, in the laminated band pass filter 500, since unintended capacitive coupling occurs between the between-input-and-output capacitor electrode 260 and the ground electrode 409, it has been difficult to obtain the desired pass band characteristic.

SUMMARY OF THE INVENTION

Accordingly, preferred embodiments of the present invention provide a high-frequency filter capable of obtaining a desired pass band characteristic while capacitively coupling LC parallel resonators to each other, the LC parallel resonators not being adjacent to each other, in a high-frequency filter including three or more LC parallel resonators.

According to a preferred embodiment of the present invention, a high-frequency filter includes a laminated body including a plurality of insulator layers stacked on each other, three or more LC parallel resonators that include a capacitor and a coil and are aligned in a predetermined direction, and a floating conductor not in contact with other conductors, wherein the LC parallel resonators adjacent to each other are electromagnetic-field-coupled to each other in the three or more LC parallel resonators, the capacitor includes a ground conductor provided within the laminated body and a resonance capacitor conductor arranged to face the ground conductor and generate capacitance, the coil includes a first via conductor penetrating one or more insulator layers from among the plurality of insulator layers, a second via conductor penetrating one or more insulator layers from among the plurality of insulator layers, and a line conductor provided on the insulator layer, the line conductor being electrically connected to the resonance capacitor conductor through the first via conductor and electrically connected to the ground conductor through the second via conductor, the resonance capacitor conductor and the ground conductor are located on one side with respect to the line conductor in a lamination direction, the floating conductor is provided astride within the three or more coils, and a sum of electrostatic capacitance generated between a first line conductor and a second line conductor from among a plurality of the line conductors overlapping with the floating conductor in planar view from the lamination direction and the floating conductor is larger than a sum of electrostatic capacitance generated between the resonance capacitor conductor and the floating conductor, the first line conductor being located at one end in a predetermined direction, the second line conductor being located at the other end in the predetermined direction.

According to the high-frequency filter according to a preferred embodiment of the present invention, it is possible to obtain a desired pass band characteristic while capacitively coupling LC parallel resonators to each other, the LC parallel resonators not being adjacent to each other, in a high-frequency filter including three or more LC parallel resonators.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a high-frequency filter according to preferred embodiments of the present invention and a manufacturing method therefor will be described.

Figure 1:
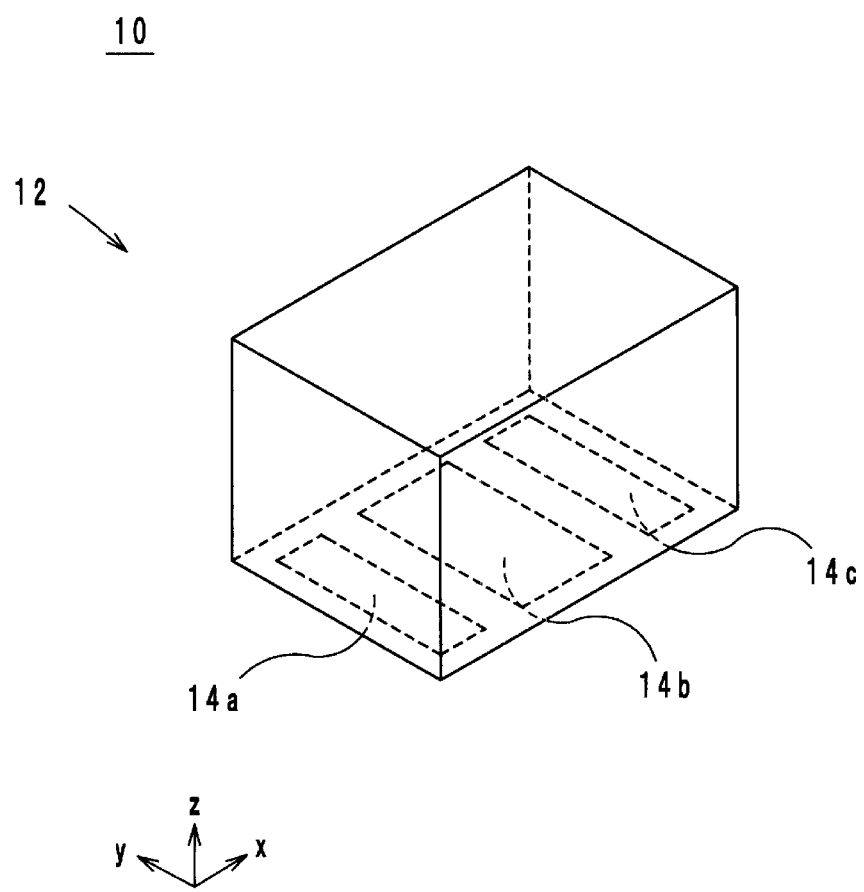
FIG. 1 is an appearance perspective view of a high-frequency filter according to a preferred embodiment of the present invention.
Figure 2:
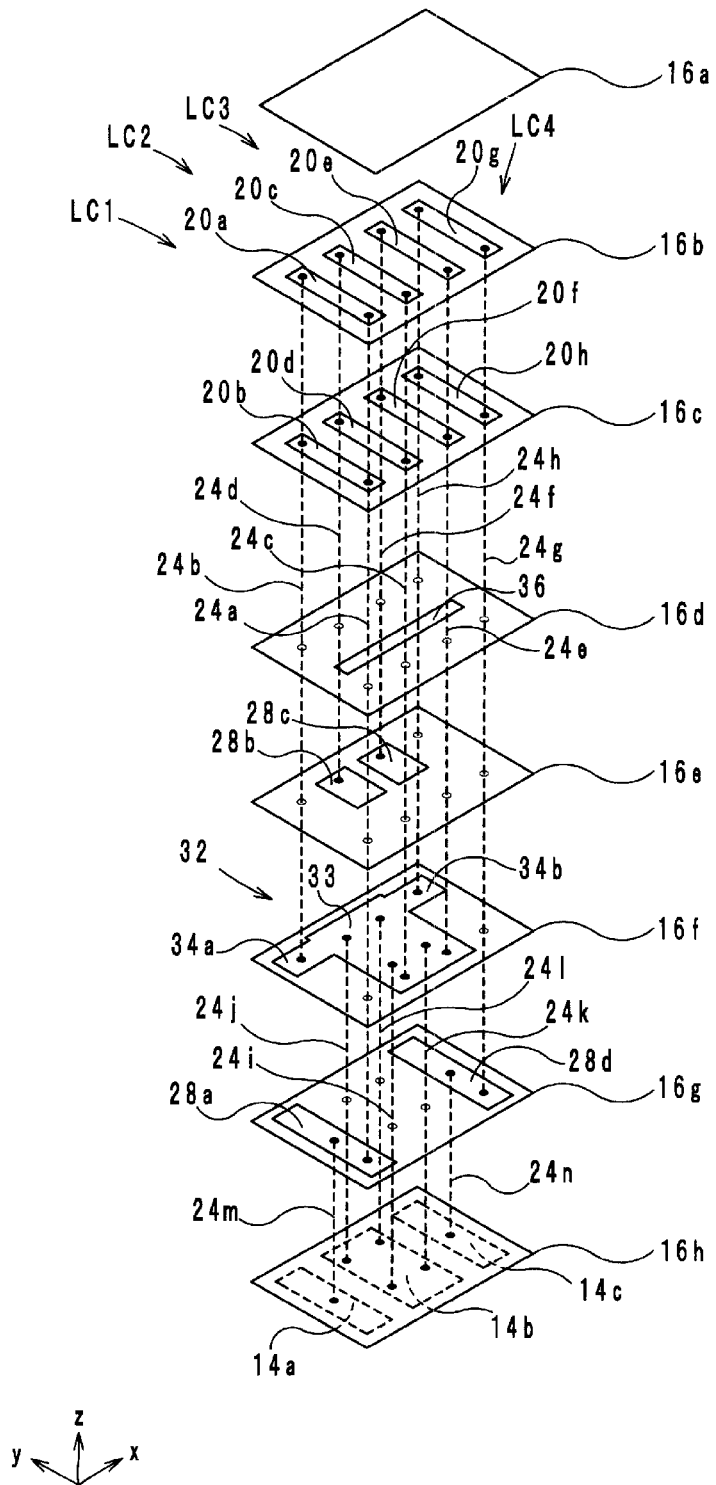
FIG. 2 is an exploded perspective view of a laminated body of a high-frequency filter according to a preferred embodiment of the present invention.
Figure 3:
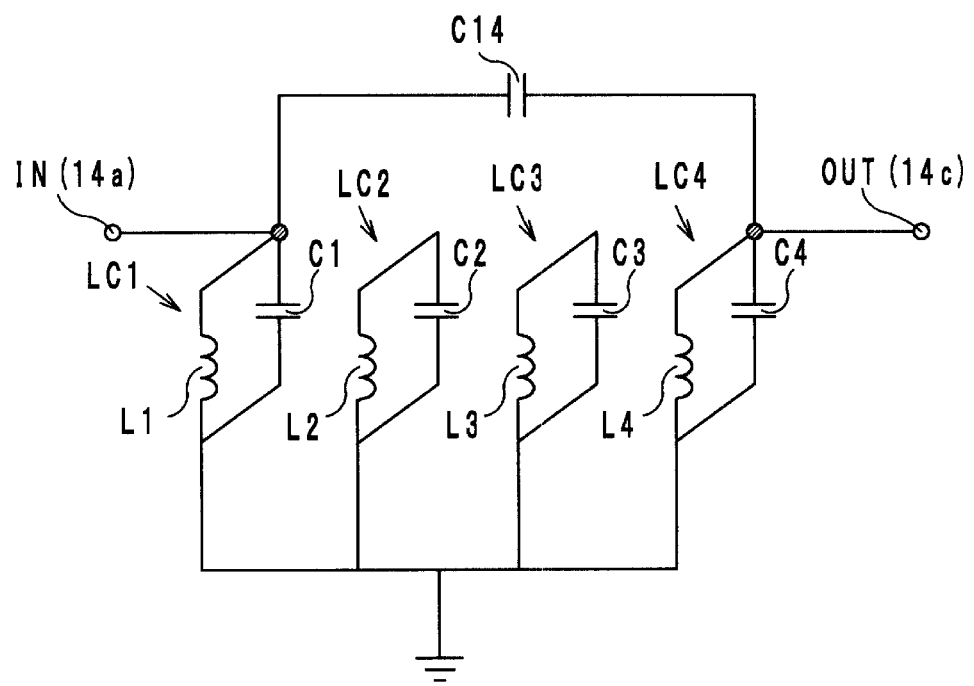
FIG. 3 is an equivalent circuit diagram of a high-frequency filter according to a preferred embodiment of the present invention.

Hereinafter, the configuration of a high-frequency filter according to a preferred embodiment of the present invention will be described with reference to drawings. FIG. 1 is the appearance perspective view of a high-frequency filter 10 according to a preferred embodiment of the present invention. FIG. 2 is the exploded perspective view of the laminated body 12 of the high-frequency filter 10 according to a preferred embodiment of the present invention. FIG. 3 is the equivalent circuit diagram of the high-frequency filter 10 according to a preferred embodiment of the present invention. Hereinafter, the lamination direction of the high-frequency filter 10 is defined as a z-axis direction, and in planar view from the z-axis direction, a direction along the long side of the high-frequency filter 10 is defined as an x-axis direction and a direction along the short side of the high-frequency filter 10 is defined as a y-axis direction. The x-axis, the y-axis, and the z-axis are perpendicular to one another.

As illustrated in FIG. 1, the high-frequency filter 10 preferably has a rectangular or substantially rectangular parallelepiped shape. In addition, as illustrated in FIG. 1 and FIG. 2, the high-frequency filter 10 includes the laminated body 12, outer electrodes 14a to 14c, LC parallel resonators LC1 to LC4 (not illustrated in FIG. 1), a floating conductor 36 (not illustrated in FIG. 1), and via conductors 24i to 24n (not illustrated in FIG. 1).

As illustrated in FIG. 2, insulator layers 16a to 16h are laminated so as to be aligned in this order from a positive direction side in the z-axis direction, and hence, the laminated body 12 is configured.

In planar view from the z-axis direction, the insulator layers 16a to 16h preferably have rectangular or substantially rectangular shapes. In addition, the material of the insulator layers 16a to 16h is, for example, a ceramic dielectric. In addition, the thickness of the insulator layer 16d is equal to or about 10 times greater than a thickness per one sheet of the other insulator layers, for example. Specifically, the thickness of the insulator layer 16d preferably is about 300 μm, and the thickness of each of the other insulator layers 16a to 16c and 16e to 16h preferably is about 15 μm, for example. Hereinafter, the surface of each insulator layer 16 on the positive direction side in the z-axis direction is referred to as a front surface, and the surface of each insulator layer 16 on a negative direction side in the z-axis direction is referred to as a back surface.

As illustrated in FIG. 1 and FIG. 2, the outer electrodes 14a, 14b, and 14c are aligned in this order so as to extend from a negative direction side in the x-axis direction to a positive direction side therein, and provided in the back surface of the high-frequency filter 10 on the negative direction side in the z-axis direction. Each of the outer electrodes 14a, 14b, and 14c preferably has a rectangular or substantially rectangle shape whose long side corresponds to the y-axis direction. In addition, the outer electrode 14a is preferably used as an input electrode. The outer electrode 14b is preferably used as a ground electrode. The outer electrode 14c is preferably used as an output electrode.

As illustrated in FIG. 2, the LC parallel resonators LC1 to LC4 are aligned along the x-axis, and define a band pass filter by LC parallel resonators adjacent to each other being electromagnetic-field-coupled to each other. In the high-frequency filter 10 according to the present preferred embodiment, the LC parallel resonators LC1 to LC4 are aligned in this order so as to extend from the negative direction side in the x-axis direction to the positive direction side therein.

As illustrated in FIG. 3, the LC parallel resonator LC1 preferably includes a capacitor C1 and a coil L1. The capacitor C1 preferably includes a ground conductor 32 illustrated in FIG. 2 and a resonance capacitor conductor 28a illustrated in FIG. 2. First, the configuration of the ground conductor 32 will be described. The ground conductor 32 includes a ground conductor central portion 33 and ground conductor ear portions 34a and 34b.

As illustrated in FIG. 2, the ground conductor central portion 33 covers approximately the whole of two central regions from among four regions obtained by evenly dividing the front surface of the insulator layer 16f with respect to straight lines parallel to the y-axis direction, and preferably has a rectangular or substantially rectangular shape whose long side corresponds to the y-axis direction. In addition, the ground conductor central portion 33 is connected to the outer electrode 14b through the via conductors 24i to 24l penetrating the insulator layers 16f, 16g, and 16h in the z-axis direction.

As illustrated in FIG. 2, the ground conductor ear portion 34a is a portion projecting so as to extend from the vicinity of an end portion on a positive direction side in the y-axis direction in the side of the ground conductor central portion 33 on the negative direction side in the x-axis direction to the negative direction side in the x-axis direction. In addition, the ground conductor ear portion 34a preferably has a rectangular or substantially rectangular shape.

The ground conductor ear portion 34b is a portion projecting so as to extend from the vicinity of an end portion on the positive direction side in the y-axis direction in the side of the ground conductor central portion 33 on the positive direction side in the x-axis direction to the positive direction side in the x-axis direction. In addition, the ground conductor ear portion 34b preferably has a rectangular or substantially rectangular shape.

As illustrated in FIG. 2, the resonance capacitor conductor 28a covers an outermost region on the negative direction side in the x-axis direction from among four regions obtained by evenly dividing the front surface of the insulator layer 16g with respect to straight lines parallel to the y-axis direction, and preferably has a rectangular or substantially rectangular shape whose long side corresponds to the y-axis direction. Furthermore, the resonance capacitor conductor 28a faces the ground conductor ear portion 34a across the insulator layer 16f. Accordingly, the ground conductor ear portion 34a (the ground conductor 32) and the resonance capacitor conductor 28a generate capacitance. In addition, the resonance capacitor conductor 28a is connected to the outer electrode 14a through the via conductor 24m penetrating the insulator layers 16g and 16h in the z-axis direction. In addition, both of the ground conductor 32 and the resonance capacitor conductor 28a are located on the negative direction side in the z-axis direction with respect to line conductors 20a to 20h. In other words, in a lamination direction, the ground conductor 32 and the resonance capacitor conductor 28a are located on one side (the negative direction side in the z-axis direction) with respect to the line conductors 20a to 20h. The same applies to resonance capacitor conductor 28b to 28d described below.

The coil L1 preferably includes the line conductors 20a and 20b and via conductors 24a and 24b. As illustrated in FIG. 2, the line conductor 20a is provided in the front surface of the insulator layer 16b and the vicinity of the side of the insulator layer 16b on the negative direction side in the x-axis direction. In addition, the line conductor 20a preferably is a linear or substantially linear conductor extending in the y-axis direction.

As illustrated in FIG. 2, the line conductor 20b is provided in the front surface of the insulator layer 16c and the vicinity of the side of the insulator layer 16c on the negative direction side in the x-axis direction. In addition, the line conductor 20b preferably is a linear or substantially linear conductor extending in the y-axis direction.

As illustrated in FIG. 2, the via conductor 24a (a first via conductor) penetrates the insulator layers 16b to 16f in the z-axis direction, and connects the end portion of the line conductor 20a on a negative direction side in the y-axis direction and the end portion of the resonance capacitor conductor 28a on the negative direction side in the y-axis direction to each other. Furthermore, the via conductor 24a penetrates the end portion of the line conductor 20b on the negative direction side in the y-axis direction. Accordingly, the line conductor 20b is connected to the line conductor 20a and the resonance capacitor conductor 28a through the via conductor 24a. In addition, while, for the sake of convenience, the via conductor 24a is treated as one via conductor, actually via conductors provided in a plurality of insulator layers lie in a line in the z-axis direction to configure the via conductor 24a. The same applies to the other via conductors.

As illustrated in FIG. 2, the via conductor 24b (a second via conductor) penetrates the insulator layers 16b to 16e in the z-axis direction, and connects the end portion of the line conductor 20a on the positive direction side in the y-axis direction and the ground conductor ear portion 34a to each other. Furthermore, the via conductor 24b penetrates the end portion of the line conductor 20b on the positive direction side in the y-axis direction. Accordingly, the line conductor 20b is electrically connected to the line conductor 20a and the ground conductor 32 through the via conductor 24b.

The coil L1 configured in such a way as described above defines a ring shape or substantially ring shape whose one end is a connection point between the via conductor 24a and the resonance capacitor conductor 28a and whose other end is a connection point between the via conductor 24b and the ground conductor ear portion 34a, the ring shape or substantially ring shape leading through the via conductor 24a, the line conductors 20a and 20b, and the via conductor 24b. In addition, a surface surrounded by the ring defined by the coil L1 is parallel or substantially parallel to a y-z plane.

As illustrated in FIG. 3, the LC parallel resonator LC2 preferably includes a capacitor C2 and a coil L2. The capacitor C2 preferably includes the ground conductor 32 and the resonance capacitor conductor 28b.

As illustrated in FIG. 2, the resonance capacitor conductor 28b is provided near a center in the x-axis direction and in a region on the negative direction side in the x-axis direction, in the front surface of the insulator layer 16e, and in planar view from the z-axis direction, the resonance capacitor conductor 28b overlaps with a region on the positive direction side in the y-axis direction in the ground conductor central portion 33. Accordingly, the resonance capacitor conductor 28b faces the ground conductor central portion 33 (the ground conductor 32) across the insulator layer 16e. Accordingly, the resonance capacitor conductor 28b and the ground conductor 32 generate capacitance. In addition, the resonance capacitor conductor 28b preferably has a rectangular or substantially rectangular shape whose long side corresponds to the y-axis direction.

The coil L2 preferably includes the line conductors 20c and 20d and via conductors 24c and 24d. As illustrated in FIG. 2, the line conductor 20c is provided in the front surface of the insulator layer 16b. In addition, the line conductor 20c is located on the positive direction side in the x-axis direction with respect to the line conductor 20a, and adjacent to the line conductor 20a. Furthermore, the line conductor 20c preferably is a linear or substantially linear conductor extending in the y-axis direction.

As illustrated in FIG. 2, the line conductor 20d is provided in the front surface of the insulator layer 16c. In addition, the line conductor 20d is located on the positive direction side in the x-axis direction with respect to the line conductor 20b, and adjacent to the line conductor 20b. Furthermore, the line conductor 20d preferably is a linear or substantially linear conductor extending in the y-axis direction.

As illustrated in FIG. 2, the via conductor 24c (the second via conductor) penetrates the insulator layers 16b to 16e in the z-axis direction, and connects the end portion of the line conductor 20c on the negative direction side in the y-axis direction and a region on the negative direction side in the y-axis direction in the ground conductor central portion 33 to each other. Furthermore, the via conductor 24c penetrates the end portion of the line conductor 20d on the negative direction side in the y-axis direction. Accordingly, the line conductor 20d is connected to the line conductor 20c and the ground conductor 32 through the via conductor 24c.

As illustrated in FIG. 2, the via conductor 24d (the first via conductor) penetrates the insulator layers 16b to 16d in the z-axis direction, and connects the end portion of the line conductor 20c on the positive direction side in the y-axis direction and the resonance capacitor conductor 28b to each other. Furthermore, the via conductor 24d penetrates the end portion of the line conductor 20d on the positive direction side in the y-axis direction. Accordingly, the line conductor 20d is connected to the line conductor 20c and the resonance capacitor conductor 28b through the via conductor 24d.

The coil L2 configured in such a way as described above defines a ring shape or substantially ring shape whose one end is a connection point between the via conductor 24c and the ground conductor central portion 33 and whose other end is a connection point between the via conductor 24d and the resonance capacitor conductor 28b, the ring shape or substantially ring shape leading through the via conductor 24c, the line conductors 20c and 20d, and the via conductor 24d. In addition, a surface surrounded by the ring defined by the coil L2 is parallel or substantially parallel to the y-z plane.

As illustrated in FIG. 3, the LC parallel resonator LC3 preferably includes a capacitor C3 and a coil L3. The capacitor C3 preferably includes the ground conductor 32 and the resonance capacitor conductor 28c.

As illustrated in FIG. 2, the resonance capacitor conductor 28c is provided near a center in the x-axis direction and in a region on the positive direction side in the x-axis direction, in the front surface of the insulator layer 16e, and in planar view from the z-axis direction, the resonance capacitor conductor 28c overlaps with a region on the positive direction side in the y-axis direction in the ground conductor central portion 33. Accordingly, the resonance capacitor conductor 28c faces the ground conductor central portion 33 (the ground conductor 32) across the insulator layer 16e. Accordingly, the resonance capacitor conductor 28c and the ground conductor 32 generate capacitive coupling. In addition, the resonance capacitor conductor 28c preferably has a rectangular or substantially rectangular shape whose long side corresponds to the y-axis direction.

The coil L3 preferably includes the line conductors 20e and 20f and the via conductors 24e and 24f. As illustrated in FIG. 2, the line conductor 20e is located in the front surface of the insulator layer 16b and on the positive direction side in the x-axis direction with respect to the line conductor 20c, and adjacent to the line conductor 20c. In addition, the line conductor 20e preferably is a linear or substantially linear conductor extending in the y-axis direction.

As illustrated in FIG. 2, the line conductor 20f is located in the front surface of the insulator layer 16c and on the positive direction side in the x-axis direction with respect to the line conductor 20d, and adjacent to the line conductor 20d. In addition, the line conductor 20f preferably is a linear or substantially linear conductor extending in the y-axis direction.

As illustrated in FIG. 2, the via conductor 24e (the second via conductor) penetrates the insulator layers 16b to 16e in the z-axis direction, and connects the end portion of the line conductor 20e on the negative direction side in the y-axis direction and a region on the negative direction side in the y-axis direction in the ground conductor central portion 33 to each other. Furthermore, the via conductor 24e penetrates the end portion of the line conductor 20f on the negative direction side in the y-axis direction. Accordingly, the line conductor 20f is connected to the line conductor 20e and the ground conductor 32 through the via conductor 24e.

As illustrated in FIG. 2, the via conductor 24f (the first via conductor) penetrates the insulator layers 16b to 16d in the z-axis direction, and connects the end portion of the line conductor 20e on the positive direction side in the y-axis direction and the resonance capacitor conductor 28c to each other. Furthermore, the via conductor 24f penetrates the end portion of the line conductor 20f on the positive direction side in the y-axis direction. Accordingly, the line conductor 20f is connected to the line conductor 20e and the resonance capacitor conductor 28c through the via conductor 24f.

The coil L3 configured in such a way as described above defines a ring shape or substantially ring shape whose one end is a connection point between the via conductor 24e and the ground conductor central portion 33 and whose other end is a connection point between the via conductor 24f and the resonance capacitor conductor 28c, the ring shape or substantially ring shape leading through the via conductor 24e, the line conductors 20e and 20f, and the via conductor 24f. In addition, a surface surrounded by the ring defined by the coil L3 is parallel or substantially parallel to the y-z plane.

As illustrated in FIG. 3, the LC parallel resonator LC4 preferably includes a capacitor C4 and a coil L4. The capacitor C4 preferably includes the ground conductor 32 and the resonance capacitor conductor 28d.

As illustrated in FIG. 2, the resonance capacitor conductor 28d covers an outermost region on the positive direction side in the x-axis direction from among four regions obtained by evenly dividing the front surface of the insulator layer 16g with respect to straight lines parallel to the y-axis direction, and preferably has a rectangular or substantially rectangular shape whose long side corresponds to the y-axis direction. Furthermore, the resonance capacitor conductor 28d faces the ground conductor ear portion 34b (the ground conductor 32) across the insulator layer 16f. Accordingly, the resonance capacitor conductor 28d and the ground conductor 32 generate capacitance. In addition, the resonance capacitor conductor 28d is connected to the outer electrode 14c through the via conductor 24n penetrating the insulator layers 16g and 16h in the z-axis direction.

The coil L4 preferably includes the line conductors 20g and 20h and the via conductors 24g and 24h. As illustrated in FIG. 2, the line conductor 20g is provided in the front surface of the insulator layer 16b and the vicinity of the side of the insulator layer 16b on the positive direction side in the x-axis direction. In addition, the line conductor 20g preferably is a linear or substantially linear conductor extending in the y-axis direction.

As illustrated in FIG. 2, the line conductor 20h is provided in the front surface of the insulator layer 16c and the vicinity of the side of the insulator layer 16c on the positive direction side in the x-axis direction. In addition, the line conductor 20h preferably is a linear or substantially linear conductor extending in the y-axis direction.

As illustrated in FIG. 2, the via conductor 24g (the first via conductor) penetrates the insulator layers 16b to 16f in the z-axis direction, and connects the end portion of the line conductor 20g on the negative direction side in the y-axis direction and the end portion of the resonance capacitor conductor 28d on the negative direction side in the y-axis direction to each other. Furthermore, the via conductor 24g penetrates the end portion of the line conductor 20h on the negative direction side in the y-axis direction. Accordingly, the line conductor 20h is connected to the line conductor 20g and the resonance capacitor conductor 28d through the via conductor 24g.

As illustrated in FIG. 2, the via conductor 24h (the second via conductor) penetrates the insulator layers 16b to 16e in the z-axis direction, and connects the end portion of the line conductor 20g on the positive direction side in the y-axis direction and the ground conductor ear portion 34b to each other. Furthermore, the via conductor 24h penetrates the end portion of the line conductor 20h on the positive direction side in the y-axis direction. Accordingly, the line conductor 20h is connected to the line conductor 20g and the ground conductor 32 through the via conductor 24h.

The coil L4 configured in such a way as described above defines a ring shape or substantially ring shape whose one end is a connection point between the via conductor 24g and the resonance capacitor conductor 28d and whose other end is a connection point between the via conductor 24h and the ground conductor ear portion 34b, the ring shape or substantially ring shape leading through the via conductor 24g, the line conductors 20g and 20h, and the via conductor 24h. In addition, a surface surrounded by the ring defined by the coil L4 is parallel or substantially parallel to the y-z plane.

Each of the coils L1 to L4 configuring the LC parallel resonance circuits LC1 to LC4 defines the ring shape or substantially ring shape as described above, and the surface surrounded by the ring defined by each of the coils L1 to L4 is parallel or substantially parallel to the y-z plane. Furthermore, in planar view from the x-axis direction, the surfaces of the rings individually defined by the coils L1 to L4 overlap with one another. Accordingly, the coil L1 and the coil L2 adjacent to each other are electromagnetic-field-coupled to each other. In other words, the LC parallel resonator LC1 and the LC parallel resonator LC2 adjacent to each other are subjected to electromagnetic-field-coupled to each other. In the same way, the LC parallel resonator L2 and the LC parallel resonator LC3 are electromagnetic-field-coupled to each other, and the LC parallel resonator L3 and the LC parallel resonator LC4 are electromagnetic-field-coupled to each other.

The floating conductor 36 is provided near a center in the y-axis direction and in a region on the negative direction side in the y-axis direction, in the front surface of the insulator layer 16d. In addition, the floating conductor 36 preferably is a linear or substantially linear conductor provided in parallel or substantially in parallel to the x-axis direction so as to penetrate the insides of the coils L1 to L4. In other words, the floating conductor 36 is provided astride within the coils L1 to L4 (within coils included in three or more LC parallel resonators). Accordingly, in planar view from the z-axis direction, the floating conductor 36 overlaps with the line conductor 20b configuring the coil L1 and the line conductor 20h configuring the coil L4. Accordingly, the line conductors 20b and 20h and the floating conductor 36 face each other across the insulator layer 16c. As a result, in planar view from the z-axis direction, from among the line conductors 20b, 20d, 20f, and 20h overlapping with the floating conductor 36, the line conductor 20b (a first line conductor) and the line conductor 20h (a second line conductor), located in both end portions in the x-axis direction, and the floating conductor 36 generate capacitive coupling. In addition, as illustrated in FIG. 3, the sum of electrostatic capacitance occurring between the line conductors 20b and 20h and the floating conductor 36 is equal to the electrostatic capacitance C14.

In addition, in planar view from the z-axis direction, the floating conductor 36 overlaps with the ground conductor 32 and the resonance capacitor conductors 28a and 28d. However, as described above, the thickness of the insulator layer 16d is remarkably larger than the other insulator layers 16a to 16c and 16e to 16h. Accordingly, each of the electrostatic capacitance occurring between the floating conductor 36 and the ground conductor 32 and electrostatic capacitance occurring between the floating conductor 36 and the resonance capacitor conductors 28a and 28d is remarkably smaller than the electrostatic capacitance C14.

Next, a non-limiting example of a method of manufacturing a high-frequency filter according to a preferred embodiment of the present invention will be described.

First, ceramic green sheets to be the insulator layers 16 are prepared. Next, the via hole conductors 24a to 24n are individually formed in ceramic green sheets to be the insulator layers 16b to 16h. More specifically, the ceramic green sheets to be the insulator layers 16b to 16h are irradiated with a laser beam, and via holes are formed. Next, using a method such as screen printing or photolithography, the via holes are filled with a conductive paste such as Ag, Pd, Cu, Au, or the alloy thereof.

Next, using a method such as screen printing or photolithography, a conductive paste such as Ag, Pd, Cu, Au, or the alloy thereof is applied on the ceramic green sheets to be the insulator layers 16b to 16g, and the line conductors 20a to 20h, the resonance capacitor conductors 28a to 28d, the ground conductor 32, and the floating conductor 36 are formed. In addition, the formation of the line conductors 20a to 20h, the resonance capacitor conductors 28a to 28d, the ground conductor 32, and the floating conductor 36 and the filling of the conductive paste into the via holes may also be simultaneously performed.

Next, each ceramic green sheet is laminated. Specifically, the ceramic green sheet to be the insulator layer 16h is disposed. Next, the ceramic green sheet to be the insulator layer 16g is disposed on the ceramic green sheet to be the insulator layer 16h. After that, the ceramic green sheet to be the insulator layer 16g is pressure-bonded to the ceramic green sheet to be the insulator layer 16h. Such lamination and a temporal pressure bonding operation are performed in the order of the insulator layers 16h, 16g, 16f, 16e, 16d, 16c, 16b, and 16a, and hence, a mother laminated body is formed. Furthermore, this mother laminated body is subjected to main pressure bonding using an isostatic press or the like.

Using a cutting blade, the mother laminated body subjected to the main pressure bonding is cut to have a predetermined dimension. Accordingly, an unfired laminated body 12 is obtained. A binder removal process and firing are performed on this unfired laminated body 12.

The fired laminated body 12 is subjected to barrel processing. After that, owing to a method such as, for example, a dipping method, an electrode paste whose main component is Ag is applied to and furthermore burned into the surface of the laminated body 12, and hence, a silver electrode to be the outer electrode 14 is formed.

Finally, Ni plating or Sn plating is performed on the surface of the silver electrode, and hence, the outer electrode 14 is formed. Through the above-mentioned process, such a high-frequency filter 10 as illustrated in FIG. 1 is completed.

According to the high-frequency filter 10 configured in such a way as described above, it is possible to obtain a desired pass band characteristic while capacitively coupling the LC parallel resonators LC1 and LC4 to each other, the LC parallel resonators LC1 and LC4 not being adjacent to each other.

In the laminated band pass filter 500 of the related art, so as to obtain a desired pass band characteristic by capacitively coupling LC parallel resonators to each other, the LC parallel resonators not being adjacent to each other, capacitive coupling is provided between the between-input-and-output capacitor electrode 260 and the capacitor electrodes 411 and 414. However, since the capacitor electrodes 411 and 414 are located near the ground electrode 409, the between-input-and-output capacitor electrode 260 is also located near the ground electrode 409. Accordingly, in the laminated band pass filter 500, since unintended capacitive coupling occurs between the between-input-and-output capacitor electrode 260 and the ground electrode 409, it has been difficult to obtain a desired pass band characteristic.

Therefore, in the high-frequency filter 10, so as to obtain a desired pass band characteristic by capacitively coupling the LC parallel resonators LC1 and LC4 to each other, the LC parallel resonators LC1 and LC4 not being adjacent to each other, capacitive coupling is provided between the floating conductor 36 and the line conductors 20b and 20h. Accordingly, in the high-frequency filter 10, it may be unnecessary to produce capacitive coupling between the floating conductor 36 and the resonance capacitor conductors 28a and 28d. Accordingly, in the high-frequency filter 10, it is possible to increase distances between the floating conductor 36 and the resonance capacitor conductors 28a and 28d. As a result, it is possible to increase a distance between the floating conductor 36 and the ground conductor 32 located near the resonance capacitor conductors 28a and 28d, and it is possible to prevent or significantly reduce the occurrence of unintended capacitive coupling between the floating conductor 36 and the ground conductor 32. In other words, in the high-frequency filter 10, it is possible to obtain a desired pass band characteristic while capacitively coupling the LC parallel resonators LC1 and LC4 to each other, the LC parallel resonators LC1 and LC4 not being adjacent to each other.

Figure 4:
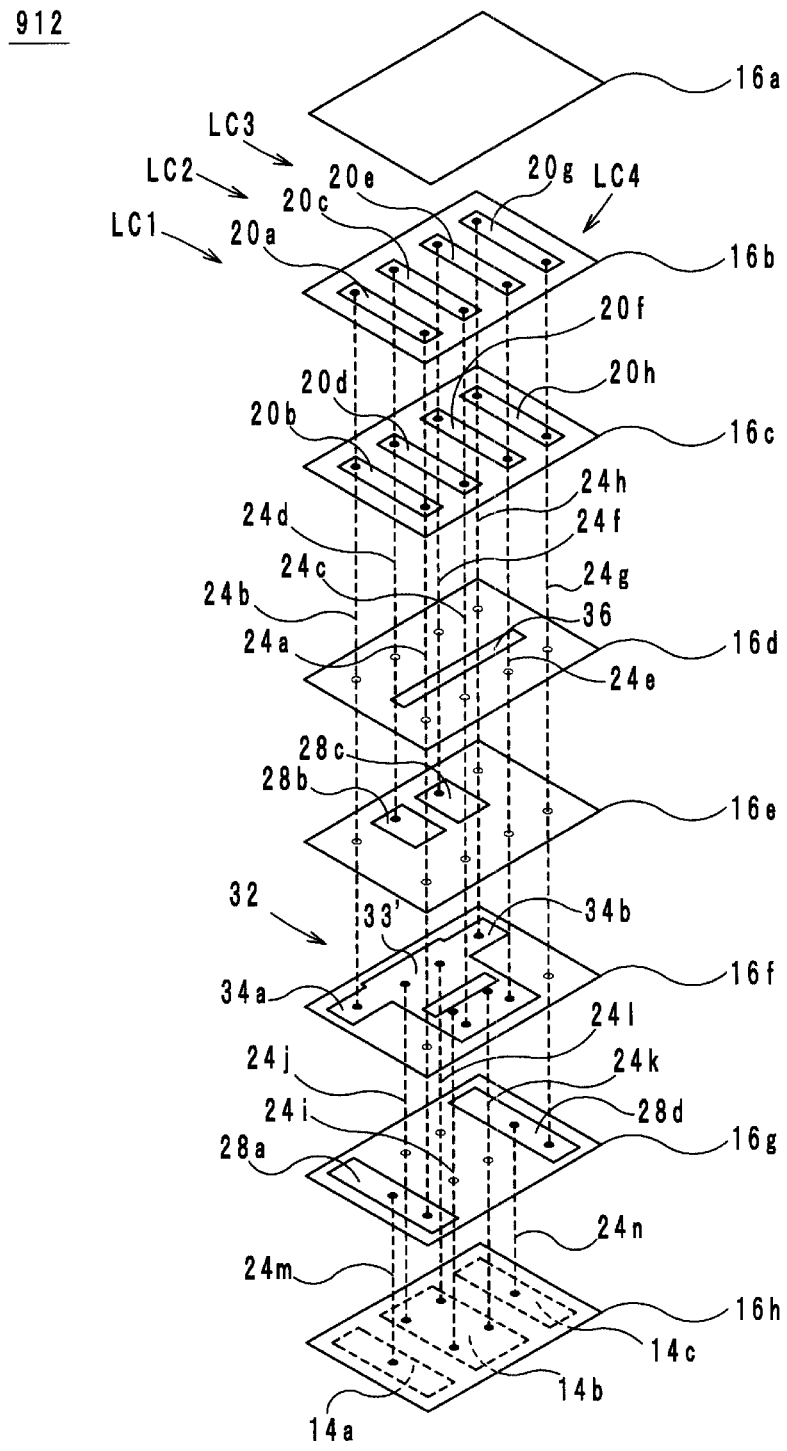
FIG. 4 is an exploded perspective view of a laminated body of a high-frequency filter according to a second sample.

In addition, the present inventor performed an experiment so as to clarify the advantageous effects achieved by the high-frequency filter 10. A first sample is a high-frequency filter 800 where the thickness of an insulator layer is changed with respect to the high-frequency filter 10, and corresponds to the lamination pass band filter 500 described in International Publication No. 2007/119356. A second sample is a high-frequency filter 900 where the shape of a ground conductor is changed with respect to the first sample. A third sample is the high-frequency filter 10. FIG. 4 is the exploded perspective view of the laminated body 912 of the high-frequency filter 900 according to the second sample. In addition, in FIG. 4 illustrating the high-frequency filter 900, the same symbol as the high-frequency filter 10 is assigned to the same configuration as the high-frequency filter 10.

In addition, when the first to third samples are designed, it is intended that the attenuation of an output signal with respect to an input signal reaches a peak at about 5.0 GHz (an attenuation pole exists). In this regard, however, when the first to third samples are designed, elements described in the circuit diagram in FIG. 3, such as the parallel resonators LC1 to LC4 and the electrostatic capacitance C14, are only considered, and so-called stray capacitance such as capacitance occurring between the floating conductor 36 and the ground conductor 32 is not considered. In the following, differences between individual samples will be described.

Differences between the high-frequency filter 800 serving as the first sample and the high-frequency filter 10 are the thicknesses of the insulator layers 16c and 16d. Specifically, while, in the high-frequency filter 10, the thickness of the insulator layer 16c is about 15 μm and the thickness of the insulator layer 16d is about 300 μm, the thickness of the insulator layer 16c is about 300 μm and the thickness of the insulator layer 16d is about 15 μm, in the high-frequency filter 800. Accordingly, in the high-frequency filter 800, by capacitively coupling the floating conductor 36 and the resonance capacitor conductors 28a and 28d to each other, the LC parallel resonators LC1 and LC4 are capacitively coupled to each other. In this regard, however, in the high-frequency filter 800, since the thickness of the insulator layer 16d is thinner than the insulator layer 16d in the high-frequency filter 10, capacitive coupling is generated between the floating conductor and the ground conductor 32. In other words, the high-frequency filter 800 shares a similarity with the lamination band pass filter 500 described in International Publication No. 2007/119356 in that capacitive coupling is generated between the floating conductor 36 and the ground conductor 32.

As illustrated in FIG. 4, there is a difference between the high-frequency filter 900 serving as the second sample and the high-frequency filter 800 serving as the first sample in that, in the high-frequency filter 900, a portion located near a center in the y-axis direction and on the negative direction side in the y-axis direction in a ground conductor central portion 33' is cut out in a substantially rectangular shape whose long side corresponds to the x-axis direction. The portion cut out in a substantially rectangular shape overlaps with the floating conductor 36 when being viewed from the z-axis direction. Accordingly, the occurrence of capacitive coupling between the floating conductor 36 and the ground conductor 32 is prevented or significantly reduced. In addition, in the same way as the high-frequency filter 800, in the high-frequency filter 900, the thickness of the insulator layer 16c is about 300 μm and the thickness of the insulator layer 16d is about 15 μm.

The third sample is the high-frequency filter 10. Accordingly, the thickness of the insulator layer 16c in the third sample is about 15 μm and the thickness of the insulator layer 16d is about 300 μm.

In the experiment, in the first sample, the second sample, and the third sample, output signals with respect to input signals serving as high-frequency waves were simulated, and attenuations were calculated.

Figure 5:
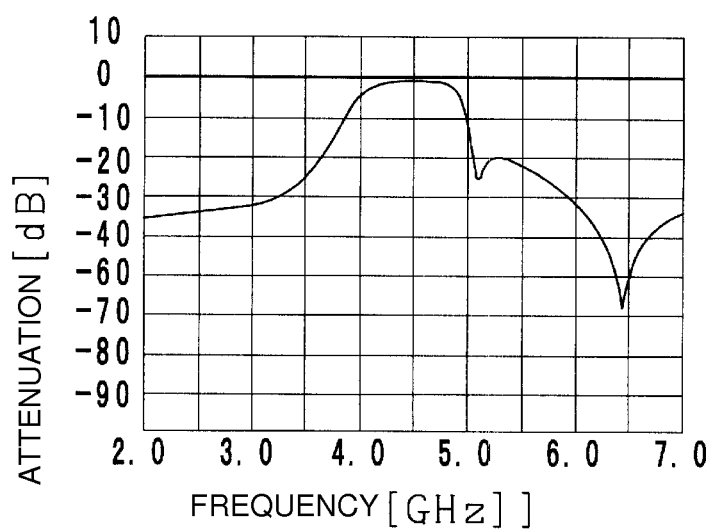
FIG. 5 is a graph illustrating a result when an experiment was performed in a first sample.
Figure 6:
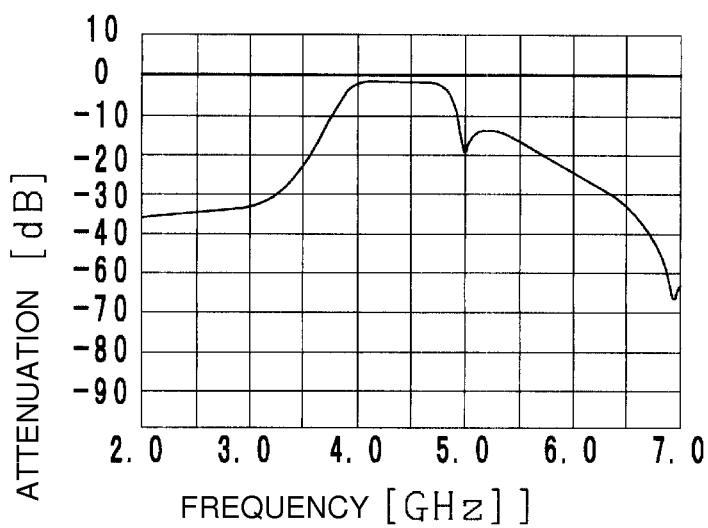
FIG. 6 is a graph illustrating a result when an experiment was performed in the second sample.
Figure 7:
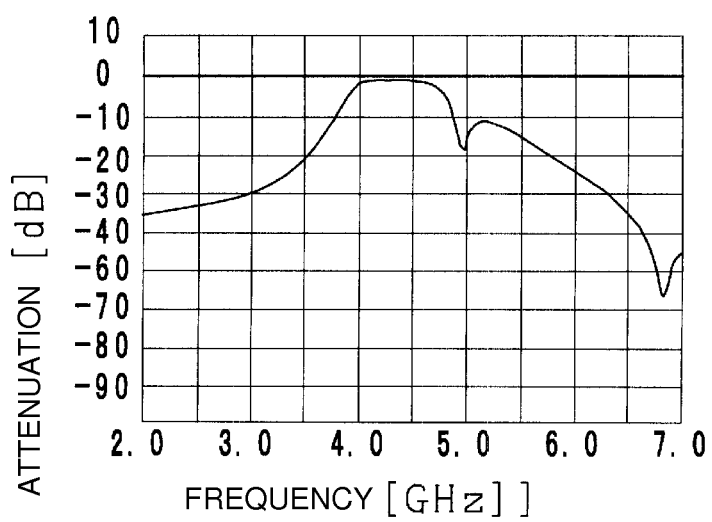
FIG. 7 is a graph illustrating a result when an experiment was performed in a third sample.

FIG. 5 is a graph illustrating a result when an experiment was performed using the first sample. FIG. 6 is a graph illustrating a result when an experiment was performed using the second sample. FIG. 7 is a graph illustrating a result when an experiment was performed using the third sample. In each of FIG. 5 to FIG. 7, a vertical axis indicates an attenuation, and a horizontal axis indicates a frequency.

As illustrated in FIG. 5, in the first sample, it is confirmed that an attenuation pole exists near about 5.2 GHz. In addition, as illustrated in FIG. 6, in the second sample, it is confirmed that an attenuation pole exists near about 5.0 GHz. The capacitive coupling between the floating conductor 36 and the ground conductor 32 in the second sample is weaker than the capacitive coupling between the floating conductor 36 and the ground conductor 32 in the first preferred embodiment. Accordingly, from the first sample and the second sample, it should be understood that the capacitive coupling between the floating conductor 36 and the ground conductor 32 became weak and hence the attenuation pole moved from about 5.2 GHz to about 5.0 GHz. In other words, from the first sample and the second sample, it should be understood that, by weakening the capacitive coupling between the floating conductor 36 and the ground conductor 32, the frequency of the attenuation pole led to a result reflecting the intention of design.

On the other hand, as illustrated in FIG. 7, in the third sample, it is confirmed that an attenuation pole exists near about 5.0 GHz. In other words, the experimental result of the third sample (the graph (FIG. 7)) is similar to the experimental result of the second sample (the graph (FIG. 6)). Accordingly, it is understood that, in such a way as the third preferred embodiment, by keeping the floating conductor 36 away from the ground conductor 32 to weaken the capacitive coupling between the floating conductor 36 and the ground conductor 32, it may also be possible to reduce the frequency of the attenuation pole. When taking into consideration the above, it is understood that, in the high-frequency filter 10, by keeping the floating conductor 36 away from the ground conductor 32 to weaken the capacitive coupling therebetween, it is possible to reduce the frequency of the attenuation pole.

Figure 8:
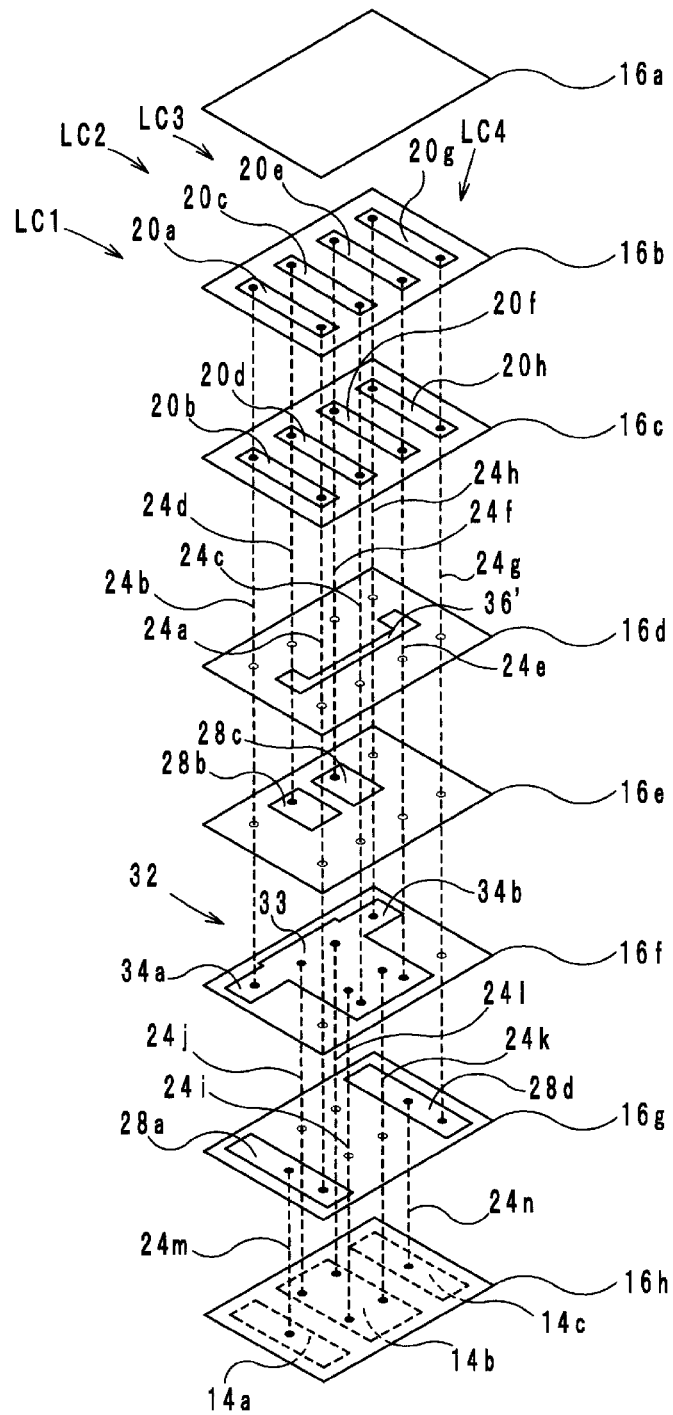
FIG. 8 is an exploded perspective view of a laminated body of a high-frequency filter according to a first example of a modification of a preferred embodiment of the present invention.

Hereinafter, a high-frequency filter 10-1 according to a first example of a modification of a preferred embodiment of the present invention will be described with reference to a drawing. FIG. 8 is the exploded perspective view of the laminated body 12-1 of the high-frequency filter 10-1 according to the first example of a modification of a preferred embodiment of the present invention.

As illustrated in FIG. 8, a difference between the high-frequency filter 10 and the high-frequency filter 10-1 is the shape of the floating conductor 36. Since, as for the other points, there is no difference between the high-frequency filter 10 and the high-frequency filter 10-1, the description thereof will be omitted. In addition, it is assumed that a floating conductor in the high-frequency filter 10-1 is a floating conductor 36'. In addition, in FIG. 8 illustrating the high-frequency filter 10-1, the same symbol as the high-frequency filter 10 is assigned to the same configuration as the high-frequency filter 10.

As illustrated in FIG. 8, in the high-frequency filter 10-1, widths in the y-axis direction in both end portions of the floating conductor 36' in the x-axis direction are larger than a width other than those of the both end portions. Accordingly, when being viewed from the z-axis direction, an area where the line conductors 20$d$ and 20$f$ (line conductors other than the first line conductor and the second line conductor) and the floating conductor 36' overlap with each other is smaller than an area where the line conductors 20$b$ and 20$h$ (the first line conductor and the second line conductor) and the floating conductor 36' overlap with each other.

Accordingly, capacitive coupling occurring between the floating conductor 36' and the line conductors 20$d$ and 20$f$ becomes weaker than capacitive coupling occurring between the floating conductor 36 and the line conductors 20$b$ and 20$h$. Accordingly, it is possible to make capacitive coupling between the LC parallel resonator LC1 and the LC parallel resonator LC4 relatively strong compared to capacitive coupling between the LC parallel resonator LC1 and the LC parallel resonator LC2, capacitive coupling between the LC parallel resonator LC2 and the LC parallel resonator LC3, and capacitive coupling between the LC parallel resonator LC3 and the LC parallel resonator LC4. Therefore, according to the high-frequency filter 10-1, it is possible to prevent or significantly reduce the occurrence of unintended capacitive coupling between the floating conductor 36 and the line conductors 20$d$ and 20$f$. As a result, it is possible to efficiently generate capacitive coupling between the LC parallel resonator LC1 and the LC parallel resonator LC4.

Furthermore, in the high-frequency filter 10-1, when being viewed from the z-axis direction, an area where the ground conductor 32 and the floating conductor 36' overlap with each other is smaller than the area of a portion where the line conductors 20$b$ and 20$h$ and the floating conductor 36' overlap with each other.

Accordingly, capacitive coupling occurring between the floating conductor 36' and the ground conductor 32 in the high-frequency filter 10-1 becomes weaker than capacitive coupling occurring between the floating conductor 36 and the ground conductor 32 in the high-frequency filter 10. Therefore, in the high-frequency filter 10-1, it is possible to further reduce or prevent the occurrence of unintended capacitive coupling, compared with the high-frequency filter 10.

As a result of the above, in the high-frequency filter 10-1, compared with the high-frequency filter 10, it is possible to obtain a desired pass band characteristic with accuracy while capacitively coupling the LC parallel resonators LC1 and LC4 to each other, the LC parallel resonators LC1 and LC4 not being adjacent to each other.

Figure 9:
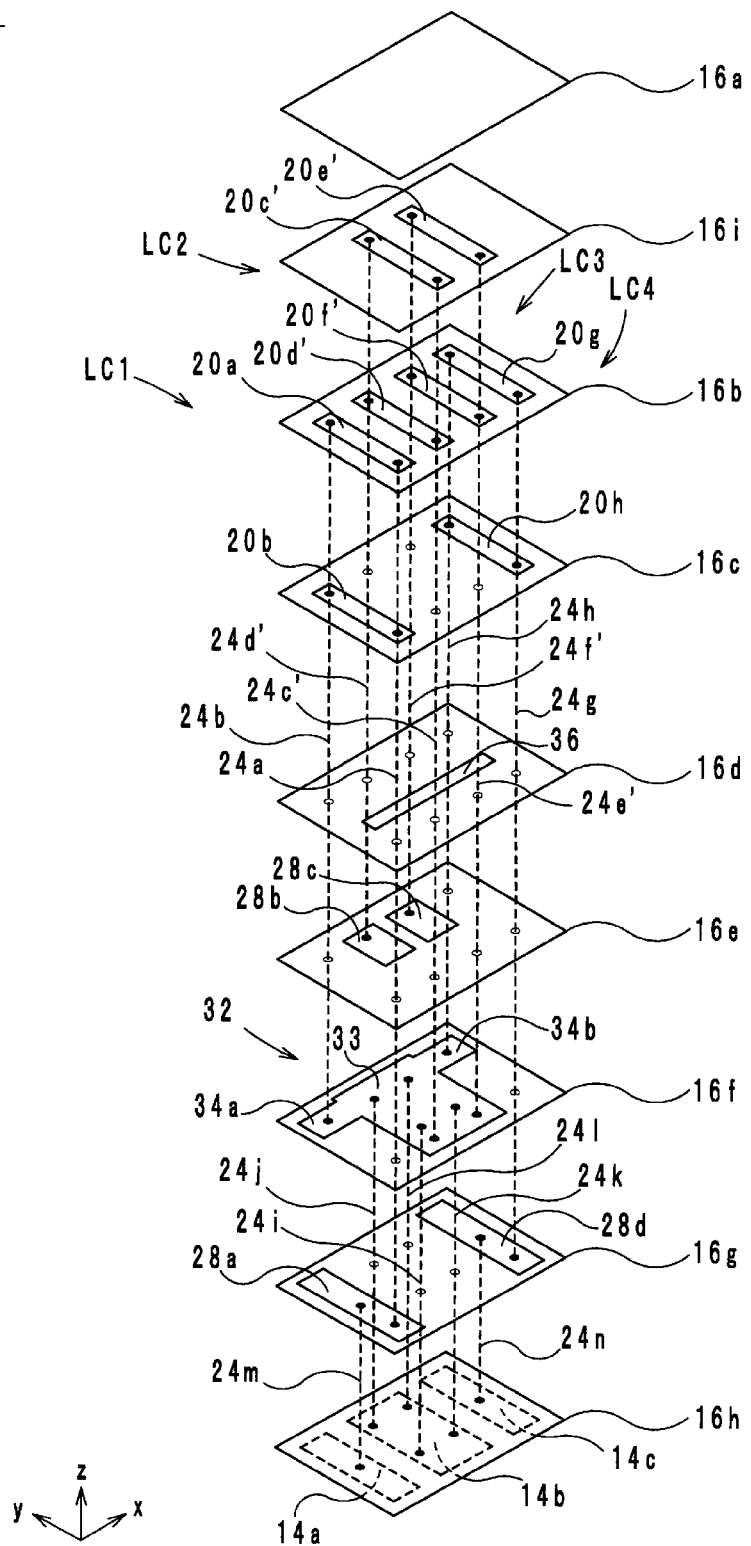
FIG. 9 is an exploded perspective view of a laminated body of a high-frequency filter according to a second example of a preferred embodiment of the present invention.
Figure 10:
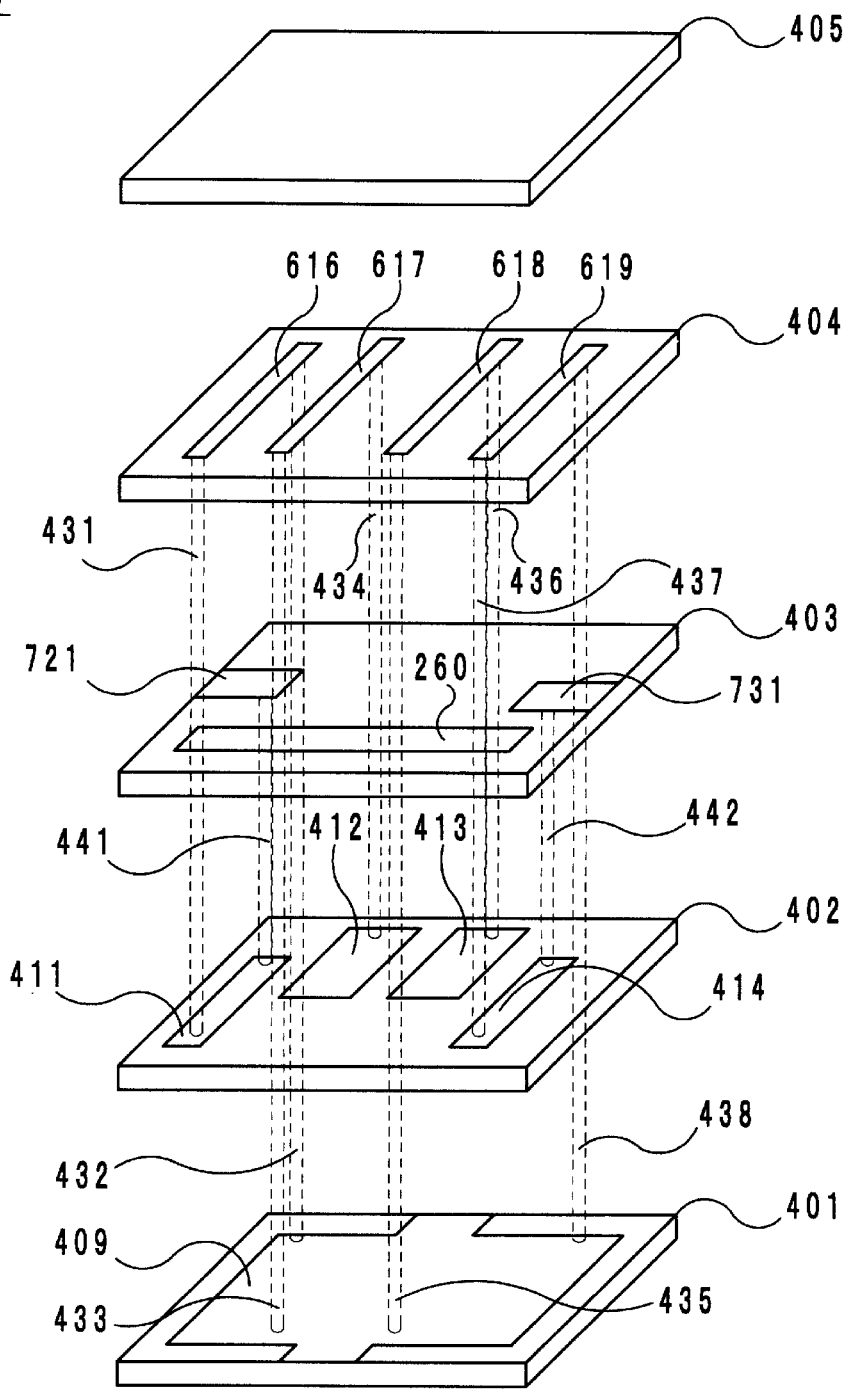
FIG. 10 is an exploded perspective view of a laminated band pass filter described in International Publication No. 2007/119356.
Figure 11:
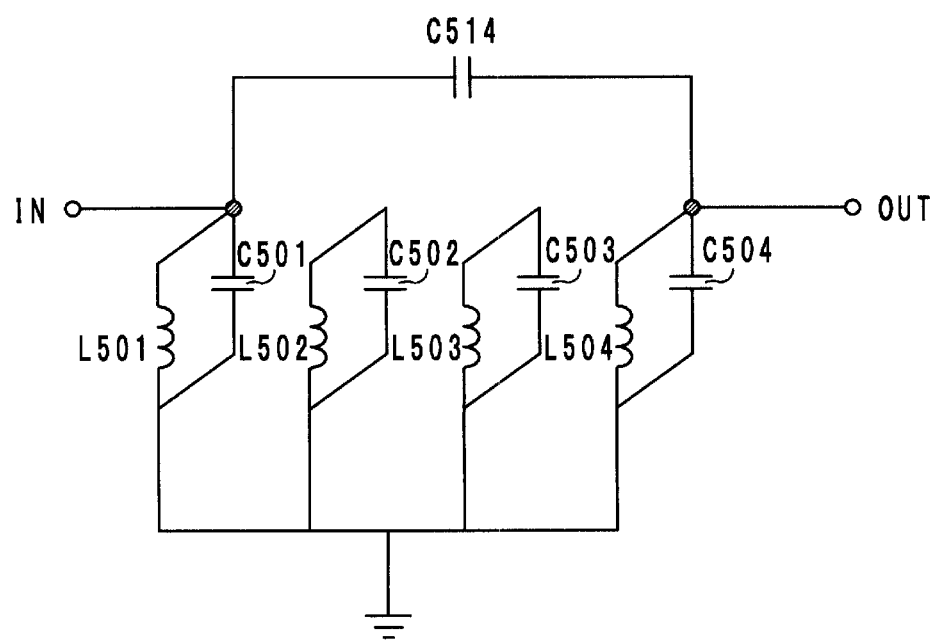
FIG. 11 is an equivalent circuit diagram of the laminated band pass filter described in International Publication No. 2007/119356.

Hereinafter, a high-frequency filter 10-2 according to a second example of a modification of a preferred embodiment of the present invention will be described with reference to a drawing. FIG. 9 is the exploded perspective view of the laminated body 12-2 of the high-frequency filter 10-2 according to the second example of a modification of a preferred embodiment of the present invention.

As illustrated in FIG. 9, differences between the high-frequency filter 10 and the high-frequency filter 10-2 are the number of the insulator layers 16 configuring the laminated body 12 and positions at which the line conductors 20$c$ to 20$f$ are provided. Since, as for the other points, there is no difference between the high-frequency filter 10 and the high-frequency filter 10-2, the description thereof will be omitted. In addition, in the high-frequency filter 10-2, it is assumed that line conductors corresponding to the line conductors 20$c$ to 20$f$ in the high-frequency filter 10 are line conductors 20$c'$ to 20$f'$. In addition, in the high-frequency filter 10-2, it is assumed that via conductors corresponding to the via conductors 24$c$ to 24$f$ in the high-frequency filter 10 are via conductors 24$c'$ to 24$f'$. In addition, in FIG. 9 illustrating the high-frequency filter 10-2, the same symbol as the high-frequency filter 10 is assigned to the same configuration as the high-frequency filter 10.

As illustrated in FIG. 9, in the high-frequency filter 10-2, the line conductors 20$d'$ and 20$f'$ are provided at positions at which the line conductors 20$c$ and 20$e$ are provided in the high-frequency filter 10. In addition, an insulator layer 16$i$ is provided between the insulator layer 16$a$ and the insulator layer 16$b$. In addition, at positions that are located in the front surface of the insulator layer 16$i$ and which overlap with the line conductors 20$d'$ and 20$f'$ in planar view from the z-axis direction, the line conductors 20$c'$ and 20$e'$ are provided. In addition, the individual line conductors 20$c'$ to 20$f'$ are connected to the ground conductor 32 and the resonance capacitor conductors 28$b$ and 28$c$ through the via conductor 24$c'$ to 24$f'$, and the connection relationship thereof is not different from the high-frequency filter 10.

In the high-frequency filter 10-2 configured in such a way as described above, the floating conductor 36 and the line conductors 20$d'$ and 20$f'$ face each other across the insulator layers 16$b$ and 16$c$. In other words, distances between the line conductors 20$d'$ and 20$f'$ and the floating conductor 36 in the high-frequency filter 10-2 are larger than distances between the line conductors 20$d$ and 20$f$ and the floating conductor 36 in the high-frequency filter 10. Accordingly, capacitive coupling occurring between the line conductors 20$d'$ and 20$f'$ and the floating conductor 36 becomes weaker than capacitive coupling occurring between the line conductors 20$d$ and 20$f$ and the floating conductor 36. Therefore, according to the high-frequency filter 10-2, it is possible to prevent or significantly reduce the occurrence of unintended capacitive coupling between the floating conductor 36 and the line conductors 20$d'$ and 20$f'$. Accordingly, it is possible to generate capacitive coupling between the LC parallel resonator LC1 and the LC parallel resonator LC4 relatively strong compared to capacitive coupling between the LC parallel resonator LC1 and the LC parallel resonator LC2, capacitive coupling between the LC parallel resonator LC2 and the LC parallel resonator LC3, and capacitive coupling between the LC parallel resonator LC3 and the LC parallel resonator LC4. In other words, in the high-frequency filter 10-2, compared with the high-frequency filter 10, it is possible to obtain a desired pass band characteristic with accuracy while capacitively coupling the LC parallel resonators LC1 and LC4 to each other, the LC parallel resonators LC1 and LC4 not being adjacent to each other.

A high-frequency filter according to preferred embodiments of the present invention is not limited to the high-frequency filter 10 according to the first preferred embodiment and the high-frequency filters 10-1 and 10-2 serving as examples of a modification of a preferred embodiment of the present invention thereof, and may be altered within the scope thereof. For example, in the first preferred embodiment, so as to increase distances between the floating conductor 36 and the resonance capacitor conductors 28a to 28d, the thickness of the insulator layer 16d may be caused to be equal to the insulator layers 16a to 16c and 16e to 16h, and a plurality of insulator layers 16 in which no conductor layer is provided may also be laminated between the insulator layer 16d and the insulator layer 16e in which the resonance capacitor conductors 28b and 28c are provided. In addition, the configuration of the high-frequency filter 10-1 may also be combined with the configuration of the high-frequency filter 10-2. Furthermore, so as not to produce unintended capacitive coupling between the floating conductor 36 and the ground electrode 33, the dielectric constants of the insulator layers 16d to 16e may also be made lower than the other insulator layers 16a to 16c and 16f to 16h.

As described above, preferred embodiments of the present invention are suitable for a high-frequency filter including a plurality of LC parallel resonators, and in particular, are superior in terms of enabling to obtain a desired pass band characteristic while capacitively coupling LC parallel resonators to each other, the LC parallel resonators not being adjacent to each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency filter comprising:
   a laminated body including a plurality of insulator layers stacked on each other in a lamination direction;
   three or more LC parallel resonators each including a capacitor and a coil and aligned in a predetermined direction; and
   a floating conductor arranged to not contact with other conductors; wherein
   adjacent ones of the three or more LC parallel resonators are electromagnetic-field-coupled to each other;
   each of the capacitors of the three or more LC parallel resonators includes a ground conductor provided within the laminated body and a resonance capacitor conductor facing the respective ground conductor and generating capacitance;
   each of the coils of the three or more LC parallel resonators includes a first via conductor penetrating one or more insulator layers of the plurality of insulator layers, a second via conductor penetrating one or more insulator layers of the plurality of insulator layers, and a line conductor provided on one of the plurality of insulator layers, the line conductor being respective electrically connected to the corresponding resonance capacitor conductor through the corresponding first via conductor and electrically connected to the corresponding ground conductor through the corresponding second via conductor;
   the resonance capacitor conductor and the ground conductors of each of the three or more LC parallel resonators are located on one side with respect to the respective line conductor of each of the three or more parallel resonators in the lamination direction;
   the floating conductor is provided astride the coils of the three or more LC parallel resonators;
   a sum of electrostatic capacitance generated between a first line conductor and the floating conductor and a second line conductor and the floating conductor is larger than a sum of electrostatic capacitance generated between the resonance capacitor conductor of each of the three or more LC parallel resonators and the floating conductor;
   the first line conductor and the second line conductor are from among the line conductors of the three or more LC parallel resonators overlapping with the floating conductor in a planar view from the lamination direction;
   the first line conductor being located at one end in the predetermined direction;
   the second line conductor being located at another end in the predetermined direction; and
   in the planar view from the lamination direction, an area where the floating conductor and the ground conductor overlap with each other is smaller than a sum of areas where the floating conductor and the first line conductor and the floating conductor and the second line conductor overlap with each other.

2. The high-frequency filter according to claim 1, wherein the at least three or more LC parallel resonators includes four LC parallel resonators arranged along the predetermined direction.

3. The high-frequency filter according to claim 1, wherein a distance between the floating conductor and the resonance capacitor conductor of each of the three or more LC parallel resonators in the lamination direction is larger than a distance between the floating conductor and the line conductor of each of the three or more LC parallel resonators in the lamination direction.

4. The high-frequency filter according to claim 1, wherein a thickness of one of the plurality of insulator layers is larger than a thickness of the remaining ones of the plurality of insulator layers.

5. The high-frequency filter according to claim 1, wherein a distance between one of the line conductors among the line conductors of the three or more LC parallel resonators other than the first line conductor and the second line conductor and the floating conductor in the lamination direction is smaller than distances between the first line conductor and the floating conductor and the second line conductor and the floating conductor in the lamination direction.

6. The high-frequency filter according to claim 1, wherein in the planar view from the lamination direction, a sum of an area where the floating conductor and one of the line conductors among the line conductors of the three or more LC parallel resonators other than the first line conductor and the second line conductor overlap with each other is smaller than a sum of areas where the floating conductor and the first line conductor and the floating conductor and the second line conductor overlap with each other.

7. The high-frequency filter according to claim 1, wherein the laminated body is rectangular or substantially rectangular and the plurality of insulator layers are rectangular or substantially rectangular.

8. The high-frequency filter according to claim 1, wherein the ground conductor of each of the three or more LC parallel resonators includes a ground conductor central portion and ground conductor ear portions.

9. The high-frequency filter according to claim 8, wherein respective ground conductor ear portions and the corresponding resonance capacitor conductor are arranged to generate capacitance.

10. The high-frequency filter according to claim 1, wherein each of the line conductors includes a linear or substantially linear conductor.

11. The high-frequency filter according to claim 1, wherein each of the coils of the three or more LC parallel resonators has a ring shape or substantially ring shape.

12. The high-frequency filter according to claim 1, wherein adjacent ones of the coils of the three or more LC parallel resonators are electromagnetic-field coupled to each other.

13. The high-frequency filter according to claim 1, wherein the floating conductor is a linear or substantially linear conductor.

14. A high-frequency filter comprising:
a laminated body including a plurality of insulator layers stacked on each other in a lamination direction;
three or more LC parallel resonators each including a capacitor and a coil and aligned in a predetermined direction; and
a floating conductor arranged to not contact with other conductors; wherein
adjacent ones of the three or more LC parallel resonators are electromagnetic-field-coupled to each other;
each of the capacitors of the three or more LC parallel resonators includes a ground conductor provided within the laminated body and a resonance capacitor conductor facing the respective ground conductor and generating capacitance;
each of the coils of the three or more LC parallel resonators includes a first via conductor penetrating one or more insulator layers of the plurality of insulator layers, a second via conductor penetrating one or more insulator layers of the plurality of insulator layers, and a line conductor provided on one of the plurality of insulator layers, the line conductor being respective electrically connected to the corresponding resonance capacitor conductor through the corresponding first via conductor and electrically connected to the corresponding ground conductor through the corresponding second via conductor;
the resonance capacitor conductor and the ground conductors of each of the three or more LC parallel resonators are located on one side with respect to the respective line conductor of each of the three or more parallel resonators in the lamination direction;
the floating conductor is provided astride the coils of the three or more LC parallel resonators;
a sum of electrostatic capacitance generated between a first line conductor and the floating conductor and a second line conductor and the floating conductor is larger than a sum of electrostatic capacitance generated between the resonance capacitor conductor of each of the three or more LC parallel resonators and the floating conductor;
the first line conductor and the second line conductor are from among the line conductors of the three or more LC parallel resonators overlapping with the floating conductor in a planar view from the lamination direction;
the first line conductor being located at one end in the predetermined direction;
the second line conductor being located at another end in the predetermined direction; and
in the planar view from the lamination direction, a sum of an area where the floating conductor and one of the line conductors among the line conductors of the three or more LC parallel resonators other than the first line conductor and the second line conductor overlap with each other is smaller than a sum of areas where the floating conductor and the first line conductor and the floating conductor and the second line conductor overlap with each other.

15. The high-frequency filter according to claim 14, wherein a distance between the floating conductor and the resonance capacitor conductor of each of the three or more LC parallel resonators in the lamination direction is larger than a distance between the floating conductor and the line conductor of each of the three or more LC parallel resonators in the lamination direction.

16. The high-frequency filter according to claim 15, wherein a distance between one of the line conductors among the line conductors of the three or more LC parallel resonators other than the first line conductor and the second line conductor and the floating conductor in the lamination direction is smaller than distances between the first line conductor and the floating conductor and the second line conductor and the floating conductor in the lamination direction.

17. A high-frequency filter comprising:
a laminated body including a plurality of insulator layers stacked on each other in a lamination direction;
three or more LC parallel resonators each including a capacitor and a coil and aligned in a predetermined direction; and
a floating conductor arranged to not contact with other conductors; wherein
adjacent ones of the three or more LC parallel resonators are electromagnetic-field-coupled to each other;
each of the capacitors of the three or more LC parallel resonators includes a ground conductor provided within the laminated body and a resonance capacitor conductor facing the respective ground conductor and generating capacitance;
each of the coils of the three or more LC parallel resonators includes a first via conductor penetrating one or more insulator layers of the plurality of insulator layers, a second via conductor penetrating one or more insulator layers of the plurality of insulator layers, and a line conductor provided on one of the plurality of insulator layers, the line conductor being respective electrically connected to the corresponding resonance capacitor conductor through the corresponding first via conductor and electrically connected to the corresponding ground conductor through the corresponding second via conductor;
the resonance capacitor conductor and the ground conductors of each of the three or more LC parallel resonators are located on one side with respect to the respective line conductor of each of the three or more parallel resonators in the lamination direction;
the floating conductor is provided astride the coils of the three or more LC parallel resonators;
a sum of electrostatic capacitance generated between a first line conductor and the floating conductor and a second line conductor and the floating conductor is larger than a sum of electrostatic capacitance generated between the resonance capacitor conductor of each of the three or more LC parallel resonators and the floating conductor;

the first line conductor and the second line conductor are from among the line conductors of the three or more LC parallel resonators overlapping with the floating conductor in a planar view from the lamination direction;

the first line conductor being located at one end in the predetermined direction;

the second line conductor being located at another end in the predetermined direction; and a distance between one of the line conductors among the line conductors of the three or more LC parallel resonators other than the first line conductor and the second line conductor and the floating conductor in the lamination direction is smaller than distances between the first line conductor and the floating conductor and the second line conductor and the floating conductor in the lamination direction.

18. The high-frequency filter according to claim 17, wherein in the planar view from the lamination direction, a sum of an area where the floating conductor and one of the line conductors among the line conductors of the three or more LC parallel resonators other than the first line conductor and the second line conductor overlap with each other is smaller than a sum of areas where the floating conductor and the first line conductor and the second line conductor overlap with each other.

19. The high-frequency filter according to claim 17, wherein a distance between the floating conductor and the resonance capacitor conductor of each of the three or more LC parallel resonators in the lamination direction is larger than a distance between the floating conductor and the line conductor of each of the three or more LC parallel resonators in the lamination direction.

* * * * *